United States Patent [19]

Inzoli et al.

[11] 4,352,994
[45] Oct. 5, 1982

[54] DOUBLE-FACE PRINTED-CIRCUIT BOARD

[75] Inventors: Luciano Inzoli, Lodi; Gino Piccioni, Noviglia, both of Italy

[73] Assignee: Italtel Societa Italiana Telecomunicazioni S.p.A., Milan, Italy

[21] Appl. No.: 261,698

[22] Filed: May 8, 1981

[30] Foreign Application Priority Data

May 9, 1980 [IT] Italy ................................ 21934 A/80

[51] Int. Cl.³ .............................................. H02J 1/00
[52] U.S. Cl. .................................................. 307/149
[58] Field of Search ......................................... 307/149

[56] References Cited

U.S. PATENT DOCUMENTS 4,001,672 1/1977 Postolaty et al. ............... 367/149 X Primary Examiner—Michael L. Gellner
Attorney, Agent, or Firm—Karl F. Ross

[57] ABSTRACT

A printed-circuit board designed to energize a multiplicity of integrated chips or other modular units comprises on a first face two closely spaced main conductor strips, respectively connected to an ungrounded and a grounded terminal of a d-c source, extending along an edge thereof, together with a number of ancillary ground conductors paralleling these strips at substantially equispaced locations. The second face carries a multiplicity of branch lines perpendicular to the strips, each line consisting of two closely spaced leads respectively joined to the ungrounded strip and to the main and ancillary ground conductors through connectors traversing the board. The leads of each branch line are bridged by several storage capacitors and are so spaced apart and dimensioned as to provide a line inductance low enough to make the resonance frequency of the line substantially higher than the operating frequency of the associated loads. Each modular unit has two rows of terminal pins which straddle one of the branch lines and are connected to the leads thereof by short stubs, these chips lying singly or in small groups between the mutually parallel conductors located on the opposite face.

6 Claims, 2 Drawing Figures

DOUBLE-FACE PRINTED-CIRCUIT BOARD

FIELD OF THE INVENTION

Our present invention relates to a printed-circuit board designed to energize a multiplicity of loads such as integrated chips or other modular units from a source of direct current having one grounded and one ungrounded terminal.

BACKGROUND OF THE INVENTION

In the design of electronic systems using integrated circuitry it is convenient to provide standardized printed-circuit boards with a conductor array capable of supplying a variety of modular units having different sets of terminal pins. The connections between these pins and the supply conductors should be as short as possible and the conductors themselves ought to be so distributed on the board that switching operations carried out on any associated modular unit will not objectionably affect the voltages fed to the remaining loads.

An elegant solution of this problem involves the complete metallization of one face of such a board, the metallic layer on that face then acting as a common ground conductor for all the modular units connected to the ungrounded supply terminal by a set of conductor strips disposed on the opposite face. The resulting close spacing between these live strips and the grounded layer, corresponding to the thickness of the dielectric substrate of the board, minimizes the voltage drop along the strips induced by switching signals in the integrated circuits connected thereto. This solution, however, frequently requires an insulation of the grounded layer from other circuit elements by the provision of two dielectric plates between which that layer is sandwiched; the exposed faces of both plates can then be used to accommodate integrated chips or other loads to be connected across the d-c source. A drawback of such a stacked printed-circuit board, however, resides in the inaccessibility of the grounded layer so that even minor defects thereof make it necessary to discard the board.

OBJECT OF THE INVENTION

Thus, the object of our present invention is to provide a printed-circuit board with two accessible faces which preserves the advantage of close spacing between grounded and ungrounded supply leads while enabling a large number of loads to be energized thereby.

SUMMARY OF THE INVENTION

We realize this object, in accordance with our present invention, by providing a generally rectangular dielectric plate with a first and a second main conductor strip on one of its face and close to an edge thereof, these strips being respectively connected to an ungrounded and a grounded supply terminal. The same face also carries a multiplicity of ancillary conductor strips disposed parallel to the main strips and preferably equidistant from one another. On the opposite face of the plate we provide a multiplicity of branch lines which preferably are also equispaced and extend perpendicularly to the main and ancillary conductor strips, each branch line consisting of two closely spaced leads which are respectively joined—via connectors traversing the plate—to the first and the second main strip; the lead tied to the grounded second main strip is also joined, by way of similar connectors, to all the ancillary strips which are thereby also grounded.

In this way, practically the entire plate surface is divided into a multiplicity of rectangular meshes or cells bounded on their major sides by the branch lines and on their minor sides by the ancillary conductor strips on opposite board faces. These rectangles should be so dimensioned as to accommodate the largest unit to be energized, with two rows of terminal pins of that unit respectively connected to the leads of a branch line between crossing of that line over conductor strips on the other face.

BRIEF DESCRIPTION OF THE DRAWING

The above and other features of our invention will now be described in detail with reference to the accompanying drawing in which.

SPECIFIC DESCRIPTION

Figure 1:
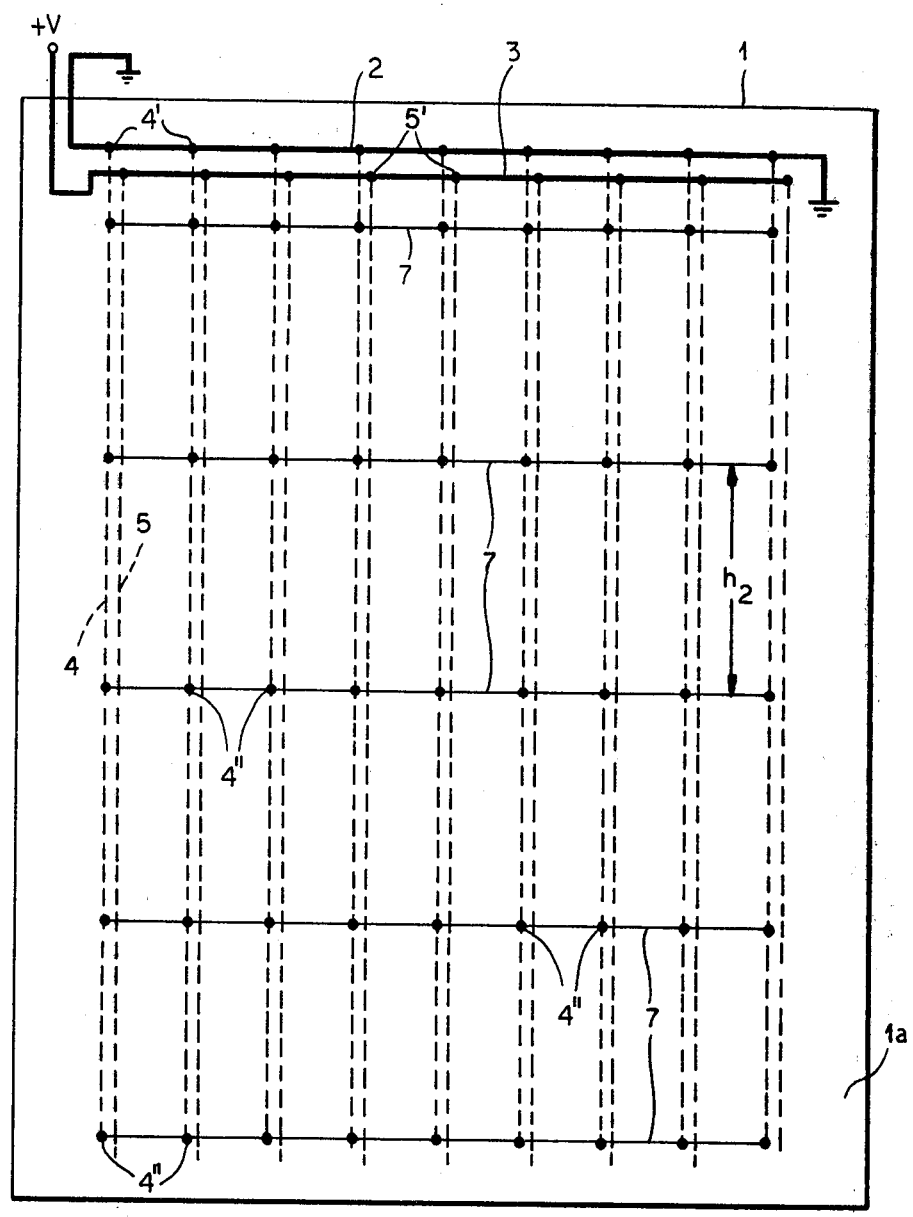
FIG. 1 is a face view of one side of a printed-circuit board embodying our invention.
Figure 2:
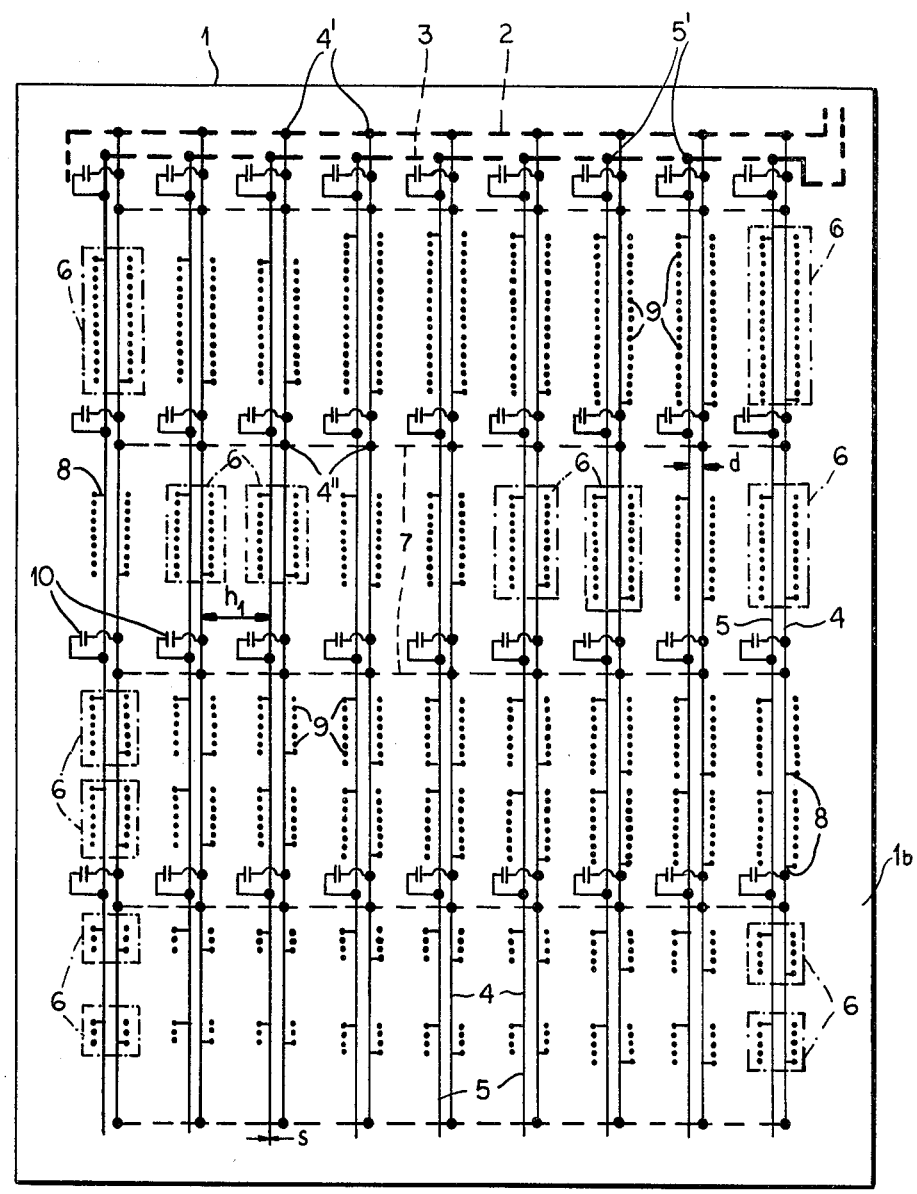
FIG. 2 is a face view of the opposite side of the board shown in FIG. 1.

In FIGS. 1 and 2 we have shown a printed-circuit board 1 in the form of a rectangular dielectric plate of small thickness serving for the energization of a multiplicty of loads with direct current. A face 1a of plate 1, seen in FIG. 1, carries two main conductor strips or buses 2 and 3 respectively connected to a grounded terminal and to a live terminal, carrying a voltage +V, of a d-c power supply not further illustrated. Buses 2 and 3 extend close to an edge of plate 1 which is proximal to the external power supply; in the present instance, this edge constitutes one of the minor sides of the rectangular board.

Face 1a also carries several ancillary conductors 7, all parallel to strips 2 and 3, which are mutually equispaced by a distance $h_2$ and form crossover points with a larger number of branch lines on the opposite plate face 1b seen in FIG. 2. Each of these branch lines consists of two closely spaced leads 4 and 5 in the form of conductor strips extending perpendicularly to strips 2, 3 and 7, the several branch lines being mutually equispaced by a distance $h_1$. All leads 4 are conductively joined to the grounded bus 2 and to each ancillary strip 7 by means of short, pin-shaped connectors, schematically indicated at 4' and 4", traversing the plate 1; similar connectors 5' conductively join the several leads 5 to the ungrounded bus 3. The spacing d between leads 4 and 5 of each line is of the same order of magnitude as the thickness of plate 1 and is a small fraction of distance $h_1$.

The loads to be supplied by the array of conductor strips 2–5 are a multiplicity of integrated modular units 6 of various sizes, referred to hereinafter as chips, disposed on face 1b of plate 1; the rectangular outlines of several such chips have been indicated in phantom lines in FIG. 2. Each chip 6 comprises two parallel rows of terminal pins 9 whose number varies, in the illustrated example, from a maximum of 20 to a minimum of 3 pins per row. These rows are separated by a distance which exceeds the spacing d of leads 4, 5 of each branch line so that these leads are straddled by the terminal pins of the associated chips. Short conductive stubs 8 on face 1b connect each pin 9 to the line lead proximal thereto. Within each chip, of course, logical circuitry including suitable electronic switches establishes the necessary connections between these pins and the components to be energized thereby.

All the chips 6 are of substantially the same width sufficiently smaller than distance $h_1$ to allow their spaced juxtaposition in tiers parallel to buses 2 and 3. Distance $h_2$, on the other hand, is large enough to accommodate a single one of the larger chips (e.g. with 20 to 40 pins) and two or more of the smaller chips (with 6 to 18 pins) in the zones bounded by ancillary strips 7. The purpose of the ancillary conductors 7 is to minimize the voltage drops along the grounded leads 4 in any of these zones by distributing the signal pulses from the various chips among all the branch lines.

Also shown in FIG. 2 are a set of storage capacitors 10 connected across each branch line 4, 5 in order to make sufficient energy available to the associated chips during peak signaling periods when, as is usual in such logical circuitry, the current flow greatly exceeds the mean supply rate. These capacitors 10 determine, together with the inherent capacitance and inductance of each line, a resonant frequency at which the line will oscillate upon being triggered by switching signals. Such oscillations are superimposed as noise upon the operating currents of the chips and are impossible to suppress in practice, yet their disturbing effects upon the signals can be reduced by making the resonance frequency of each line substantially higher than the operating frequency of its loads which in a TDM (time-division-multiplexing) system corresponds to the cadence of clock pulses common to all modular units. Since the magnitude of the associated capacitors 10 supplementing the inherent line capacitance is determined by the energy-storage requirements of the loads, a high resonance frequency can be attained only by a reduction of the inherent line inductance. Such a reduction, which also diminishes the electromagnetic coupling among adjacent lines, can be accomplished by increasing the width s and/or the thickness x of conductor strips 4, 5 as well as by minimizing their spacing d (measured between the longitudinal centerlines of the strips).

The arrangement of conductor strips 4, 5, 7 in a grid with a multiplicity of identical rectangular meshes or cells of width $h_1$ and height $h_2$ facilitates the formation of short connecting stubs 8 by automatic circuit-printing machinery under the control of stored data indicating the number of such stubs required in each cell. The joints between the stubs 8 and the terminal pins 9 of the corresponding chips are made by conventional means.

The uppermost ancillary conductor 7 of FIG. 1 could be directly replaced by the grounded bus 2 as one of the boundaries of the first tier of cells.

As will be apparent, the printed-circuit board according to our invention eliminates the need for a separate grounding of one row of terminal pins of each chip since they are directly connectable to the grounded leads 4 of the columnar branch lines on a plate face devoid of any other conductor strips.

We claim:

1. A printed-circuit board for the energization of a multiplicity of loads, comprising:
   a generally rectangular dielectric plate;
   a first and a second main conductor strip on one face of said plate close to an edge thereof, said first and second conductor strips being respectively connected to an ungrounded and a grounded terminal of a direct-current source;
   a multiplicity of ancillary conductor strips spacedly disposed parallel to said main conductor strips on said one face; and
   a multiplicity oi branch lines perpendicular to said main and ancillary conductor strips on an opposite face of said plate, each of said branch lines consisting of two closely spaced leads respectively joined to said first conductor strip and to said second and ancillary conductor strips by connectors traversing said plate.

2. A printed-circuit board as defined in claim 1 wherein the leads of each branch line are interconnected by a plurality of storage capacitors.

3. A printed-circuit board as defined in claim 1 wherein said conductor strips form with said branch lines a grid consisting of identically dimensioned rectangular meshes.

4. In combination, a printed-circuit board as defined in claim 1, 2 or 3 and a multiplicity of modular units each having an area substantially smaller than that of said board, each modular unit being provided with two rows of terminal pins respectively connected to the leads of an associated branch line on said opposite face between crossings thereof over the conductor strips on said one face.

5. The combination defined in claim 4 wherein said modular units are pulsed at a predetermined operating frequency, each of said branch lines being dimensioned to have an inductance providing a resonance frequency substantially higher than said operating frequency.

6. The combination defined in claim 4 wherein said rows of terminal pins straddle the leads of the associated branch line.

* * * * *